(12) United States Patent
Park et al.

(10) Patent No.: US 12,341,252 B2
(45) Date of Patent: Jun. 24, 2025

(54) ANTENNA SUBSTRATE AND ELECTRONIC DEVICE INCLUDING THE SAME

(71) Applicant: SAMSUNG ELECTRO-MECHANICS CO., LTD., Suwon-si (KR)

(72) Inventors: Je Sang Park, Suwon-si (KR); Yang Je Lee, Suwon-si (KR); Hyun Kyung Park, Suwon-si (KR); Chang Gun Oh, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 305 days.

(21) Appl. No.: 17/747,246

(22) Filed: May 18, 2022

(65) Prior Publication Data
US 2023/0198165 A1    Jun. 22, 2023

(30) Foreign Application Priority Data
Dec. 20, 2021    (KR) .................. 10-2021-0182705

(51) Int. Cl.
*H01Q 21/06*    (2006.01)
*H01L 23/00*    (2006.01)
(Continued)

(52) U.S. Cl.
CPC ........... *H01Q 21/065* (2013.01); *H01L 23/66* (2013.01); *H01L 24/16* (2013.01); *H01Q 1/2283* (2013.01); *H01Q 1/38* (2013.01); *H01Q 1/422* (2013.01); *H01Q 9/0407* (2013.01); *H01Q 13/18* (2013.01); *H01Q 21/28* (2013.01); *H01L 2223/6622* (2013.01);
(Continued)

(58) Field of Classification Search
CPC ...... H01Q 21/065; H01Q 1/2283; H01Q 1/38; H01Q 1/422; H01Q 9/0407; H01Q 13/18; H01Q 21/28; H01Q 1/40; H01Q 1/243; H01Q 1/46; H01L 23/66; H01L 24/16; H01L 2223/6622; H01L 2223/6677; H01L 2224/16235; H01L 2924/1421; H01L 2924/2027
See application file for complete search history.

(56) References Cited

U.S. PATENT DOCUMENTS

2016/0056544 A1*   2/2016   Garcia ................. H01Q 9/0407
                                                     343/725
2019/0058241 A1    2/2019   So et al.
(Continued)

FOREIGN PATENT DOCUMENTS

JP      2014-165218 A    9/2014
KR    10-2019-0019804 A    2/2019

*Primary Examiner* — David E Lotter
(74) *Attorney, Agent, or Firm* — Morgan, Lewis & Bockius LLP

(57) ABSTRACT

An antenna substrate includes: a first insulating layer surrounding a cavity; a second insulating layer of which at least a portion is disposed in the cavity and containing an insulating material different from an insulating material of the first insulating layer; a first patch antenna having one surface facing the first insulating layer by an amount greater than half of an area of the first patch antenna; and a second patch antenna having one surface facing the cavity by an amount greater than half of an area of the second patch antenna.

11 Claims, 14 Drawing Sheets

(51) Int. Cl.
*H01L 23/66* (2006.01)
*H01Q 1/22* (2006.01)
*H01Q 1/38* (2006.01)
*H01Q 1/42* (2006.01)
*H01Q 9/04* (2006.01)
*H01Q 13/18* (2006.01)
*H01Q 21/28* (2006.01)

(52) U.S. Cl.
CPC ............... *H01L 2223/6677* (2013.01); *H01L 2224/16235* (2013.01); *H01L 2924/1421* (2013.01); *H01L 2924/2027* (2013.01)

(56) References Cited

U.S. PATENT DOCUMENTS

2019/0326672 A1\* 10/2019 Lim ..................... H01Q 19/30
2024/0243051 A1\* 7/2024 Liao ................... H01L 23/3107

\* cited by examiner

ANTENNA SUBSTRATE AND ELECTRONIC DEVICE INCLUDING THE SAME

CROSS-REFERENCE TO RELATED APPLICATION(S)

This application claims benefit of priority to Korean Patent Application No. 10-2021-0182705 filed on Dec. 20, 2021 in the Korean Intellectual Property Office, the disclosure of which is incorporated herein by reference in its entirety.

TECHNICAL FIELD

The present disclosure relates to an antenna substrate and an electronic device including the same.

BACKGROUND

Data traffic of mobile communications is rapidly increasing every year. Active technological development is in progress to support such a rapid increase in data transfer in real time in a wireless network. For example, contents of internet of things (IoT) based data, augmented reality (AR), virtual reality (VR), live VR/AR combined with SNS, autonomous driving, applications such as Sync View (real-time image transmission from the user's point of view using an ultra-small camera), and the like may require communications (for example, 5G communications and mmWave communications) supporting transmission and reception of a large amount of data.

Since the amount of data may be efficiently increased as a frequency of a communications signal increases, the frequency of the communications signal is gradually increasing and a wavelength of the communications signal is gradually decreasing. Therefore, a wavelength of communications (for example, 5G communications or mmWave communications) supporting transmission and reception of large amounts of data may also be short. Since an attenuation rate of the communications signal in the air may be inversely proportional to the square of the wavelength, a high gain and/or maximum power of an antenna remotely transmitting and receiving a communications signal having a short wavelength may be required in consideration of the large attenuation of the communications signal in the air.

SUMMARY

An aspect of the present disclosure may provide an antenna substrate.

According to an aspect of the present disclosure, an antenna substrate may include: a first insulating layer surrounding a cavity; a second insulating layer of which at least a portion is disposed in the cavity and containing an insulating material different from an insulating material of the first insulating layer; a first patch antenna having one surface facing the first insulating layer by an amount greater than half of an area of the first patch antenna; and a second patch antenna having one surface facing the cavity by an amount greater than half of an area of the second patch antenna.

According to another aspect of the present disclosure, an antenna substrate may include: a first insulating layer surrounding a cavity; a first feed via penetrating through the first insulating layer and contacting the first insulating layer; a second feed via passing through the cavity and spaced apart from the first insulating layer; a first patch antenna configured to be fed by the first feed via; and a second patch antenna configured to be fed by the second feed via.

According to another aspect of the present disclosure, an electronic device may include: the antenna substrate; and a radio frequency integrated circuit (RFIC) that inputs or outputs a radio frequency (RF) signal to the first and second patch antennas of the antenna substrate and converts a frequency of the RF signal.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1A:
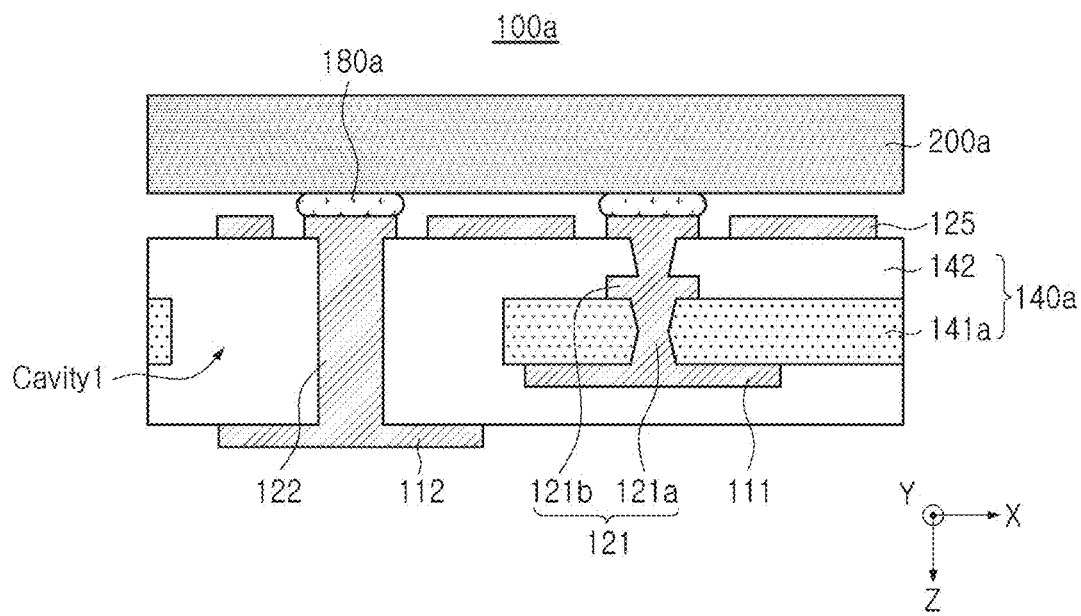
FIGS. 1A through 1F are side views illustrating antenna substrates according to an exemplary embodiment in the present disclosure.

Hereinafter, exemplary embodiments in the present disclosure will now be described in detail with reference to the accompanying drawings.

FIGS. 1A through 1F are side views illustrating antenna substrates according to an exemplary embodiment in the present disclosure.

Referring to FIGS. 1A through 1F, antenna substrates 100a, 100b, 100c, 100d, 100e, and 100f according to an exemplary embodiment in the present disclosure may respectively include a first patch antenna 111, a second patch antenna 112, and an insulating member 140a, 140b, or 140c. The insulating member 140a, 140b, or 140c may include at least one of a first insulating layer 141a, a second insulating layer 142, and a third insulating layer 141b or 141c.

For example, the antenna substrates 100a, 100b, 100c, 100d, 100e, and 100f may each be implemented as a printed circuit board in which a plurality of conductive layers and a plurality of insulating layers are alternately stacked. The plurality of insulating layers may be insulating members 140a, 140b, and 140c. The plurality of conductive layers may include the first patch antenna 111 and the second patch antenna 112, and may further include a ground layer 125. For example, the plurality of conductive layers may contain at least one of copper (Cu), silver (Ag), palladium (Pd), aluminum (Al), nickel (Ni), titanium (Ti), gold (Au), or platinum (Pt), and may be implemented by a semi-additive process (SAP), a modified semi-additive process (MSAP), or a subtractive method.

The first insulating layer 141a may surround a cavity Cavity1, Cavity2, or Cavity3. For example, since the cavity Cavity1 illustrated in FIGS. 1A and 1D may be a through cavity, the cavity Cavity1 may not be exposed to the third insulating layer 141b or 141c, and since the cavities Cavity2 and Cavity3 illustrated in FIGS. 1B, 1C, 1E, and 1F may be blind cavities, the cavities Cavity2 and Cavity3 may be exposed to the third insulating layer 141b or 141c. For example, the first insulating layer 141a may have a higher solidity than that of the second insulating layer 142, and may be a core insulating layer of the printed circuit board. For example, the first insulating layer 141a may have a higher Young's modulus than that of the second insulating layer 142. For example, the first insulating layer 141a may have a higher rigidity or hardness than that of the second insulating layer 142. The high solidity of the first insulating layer 141a may increase stability of formation of the cavity Cavity1, Cavity2, or Cavity3. For example, a difference in solidity between the first insulating layer 141a and the second insulating layer 142 may be implemented through a difference in composition of an inorganic filler added to an insulating material.

At least a portion of the second insulating layer 142 may be disposed in the cavity Cavity1, Cavity2, or Cavity3 and contain an insulating material different from that of the first insulating layer 141a. The insulating material contained in the first insulating layer 141a and an insulating material contained in the third insulating layers 141b and 141c may be the same as each other. For example, another portion of the second insulating layer 142 may be disposed on at least one of an upper surface and a lower surface of the first insulating layer 141a.

For example, the insulating material that may be contained in the first insulating layer 141a, the second insulating layer 142, and the third insulating layers 141b and 141c may be prepreg, an Ajinomoto build-up film (ABF), FR-4, bismaleimide triazine (BT), a photo imagable dielectric (PID) resin, a general copper clad laminate (CCL), or may be at least one selected from the group consisting of a thermosetting resin such as an epoxy resin, a thermoplastic resin such as polyimide, polytetrafluoroethylene (PTFE), a glass-based resin, and a ceramic-based resin (for example, low temperature co-fired ceramic (LTCC)).

The first patch antenna 111 may remotely transmit and/or receive a first radio frequency (RF) signal through one surface (for example, −Z-direction surface) and/or the other surface (for example, +Z-direction surface) of the first patch antenna 111. The second patch antenna 112 may remotely transmit and/or receive a second RF signal through one surface (for example, −Z-direction surface) and/or the other side (for example, +Z-direction surface) of the second patch antenna 112.

A structure, a shape, a material, and a relative position with respect to an adjacent component of each of the first and second patch antennas 111 and 112 may serve as the basis of an impedance that determines a resonant frequency of each of the first and second patch antennas 111 and 112. A resonant frequency of each of the first and second patch antennas 111 and 112 may form a bandwidth of each of the first and second patch antennas 111 and 112. The first and second RF signals may each have a fundamental frequency within a bandwidth, and may thus be remotely transmitted and/or received via the first and second patch antennas 111 and 112, respectively.

The first patch antenna 111 may have one surface facing the first insulating layer 141a by an amount greater than half of an area of the first patch antenna 111, and the second patch antenna 112 may have one surface facing the cavity cavities1, Cavity2, or Cavity3 by an amount greater than half of an area of the second patch antenna 112.

Therefore, the resonant frequency of the first patch antenna 111 may be affected by the insulating material contained in the first insulating layer 141a, and the resonant frequency of the second patch antenna 112 may be affected by the second insulating layer 142 or air (in a case in which the second insulating layer is not disposed in the cavity). Since the insulating materials of the first insulating layer 141a and the second insulating layer 142 are different from each other, and the first insulating layer 141a has a higher dielectric constant than that of air, a capacitance (corresponding to the dielectric constant) determining the resonant frequency of the first patch antenna 111 and a capacitance determining the resonant frequency of the second patch antenna 112 may be different from each other. Accordingly, the first and second patch antennas 111 and 112 may have different frequency bands.

The antenna substrates 100a, 100b, 100c, 100d, 100e, and 100f according to an exemplary embodiment in the present disclosure may have an advantageous structure for implementing the different frequency bands of the first and second patch antennas 111 and 112 and may not need to have a greater thickness (or the number of layers) to have the structure. For example, a thickness of a structure in which the first insulating layer 141a and the cavity Cavity1, Cavity2, or Cavity3 are combined may be the same as a thickness of one layer of the printed circuit board. Accordingly, the antenna substrates 100a, 100b, 100c, 100d, 100e, and 100f may efficiently implement different frequency bands of the first and second patch antennas 111 and 112 for a total size, and an increase in possibility of warpage of the printed circuit board caused by an increase of the number of layers may be prevented.

In addition, an influence of a dielectric boundary condition formed by a side surface of the cavity Cavity1, Cavity2, or Cavity3 on the second patch antenna 112 may be larger than that on the first patch antenna 111. For example, in a case in which the first and second patch antennas 111 and 112 are required to have different directivities from each other, the second patch antenna 112 may have a sharper directivity based on the dielectric boundary condition formed by the side surface of the cavity Cavity1, Cavity2, or Cavity3. Alternatively, a difference in dielectric boundary condition between the first and second patch antennas 111 and 112 may offset a difference in propagation characteristic of the first and second RF signals in the vicinity of the first and second patch antennas 111 and 112 based on different wavelengths of the first and second RF signals.

Meanwhile, the frequency bands of the first and second patch antennas 111 and 112 are not limited to being different from each other, and the frequency bands of the first and second patch antennas 111 and 112 may be the same as each other depending on design. For example, the structure in which the first insulating layer 141a and the cavity Cavity1, Cavity2, or Cavity3 are combined may affect a capacitance difference of the resonant frequencies of the first and second patch antennas 111 and 112. Therefore, the first and second patch antennas 111 and 112 may have substantially the same resonant frequency by using an inductance difference of the resonant frequencies of the first and second patch antennas 111 and 112. For example, the inductance difference may be implemented based on a structure difference between the first and second patch antennas 111 and 112, a structure difference between first and second feed vias 121 and 122, or a difference in specific structure of a surrounding conductive layer.

The first feed via 121 may penetrate through the first insulating layer 141a and may contact the first insulating layer 141a. For example, the first feed via 121 may be implemented as an interlayer via connecting the plurality of conductive layers of the printed circuit board in a Z-direction. Accordingly, the first feed via 121 may include an interlayer via 121a and a land 121b, but is not limited thereto.

The second feed via 122 may pass through the cavity Cavity1, Cavity2, or Cavity3 and may be spaced apart from the first insulating layer 141a. A width of the second feed via 122 may be smaller than a horizontal distance between one side of the cavity Cavity1, Cavity2, or Cavity3 and the other side. For example, the second feed via 122 may be implemented as a through-via penetrating through the second insulating layer 142 and/or the third insulating layer 141b or 141c. For example, a difference between a width of one end of the second feed via 122 and a width of a central portion of the second feed via 122 may be smaller than that of the first feed via 121, and an average width of the second feed via 122 may be wider than that of the first feed via 121.

The first and second feed vias 121 and 122 may feed power to the first and second patch antennas 111 and 112, respectively. The first and second patch antennas 111 and 112 may be configured to be fed by the first and second feed vias 121 and 122, respectively. For example, the first and second feed vias 121 and 122 may be adjacent to edges of the first and second patch antennas 111 and 112, respectively, may contact the first and second patch antennas 111 and 112, respectively, and may be electromagnetically coupled to the first and second patch antennas 111 and 112, respectively, in a non-contact manner.

The first and second feed vias 121 and 122 may be used as paths for the first and second RF signals, and may have a smaller length as compared with a wiring disposed on a plane perpendicular to the Z-direction, which may be effective in reducing a transmission loss of the first and second RF signals, and may facilitate an increase in gain and/or maximum output of the first and second patch antennas 111 and 112. Since feeding for the first and second patch antennas 111 and 112 may be implemented with a wiring, the first and second feed vias 121 and 122 may be omitted depending on design.

For example, the number of first and second feed vias 121 and 122 that feed power to the first and second patch antennas 111 and 112 may be twice or more the number of first and second patch antennas 111 and 112. Accordingly, the first and second feed vias 121 and 122 may transmit a plurality of first RF signals and a plurality of second RF signals that are in a polarized wave relationship, respectively.

The ground layer 125 may overlap with the first and second patch antennas 111 and 112 in a direction (for example, the Z-direction) in which one surfaces of the first and second patch antennas 111 and 112 face the ground layer 125, and may be in an electrical ground state. The ground layer 125 may affect the capacitances determining the resonant frequencies of the first and second patch antennas 111 and 112, and may act as an electromagnetic reflector in a process in which the first and second RF signals of the first and second patch antennas 111 and 112 are radiated.

For example, the first and second feed vias 121 and 122 may penetrate through the ground layer 125 and be spaced apart from the ground layer 125. For example, the first and second feed vias 121 and 122 may pass through at least one through-hole of the ground layer 125, and a width of the through-hole may be larger than those of the first and second feed vias 121 and 122.

Figure 1B:
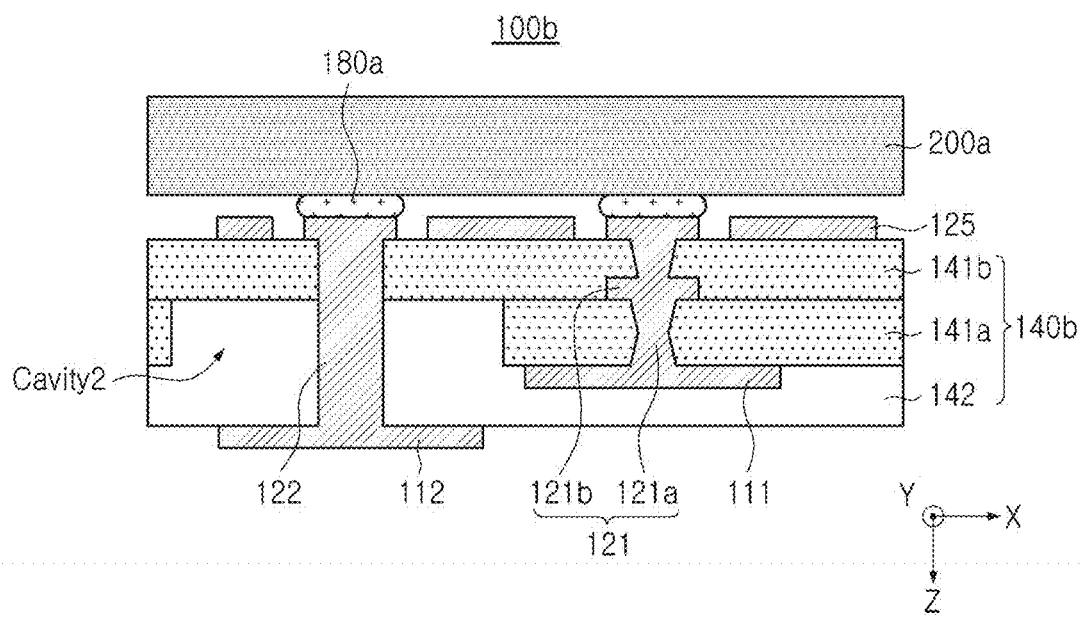
Figure 1C:
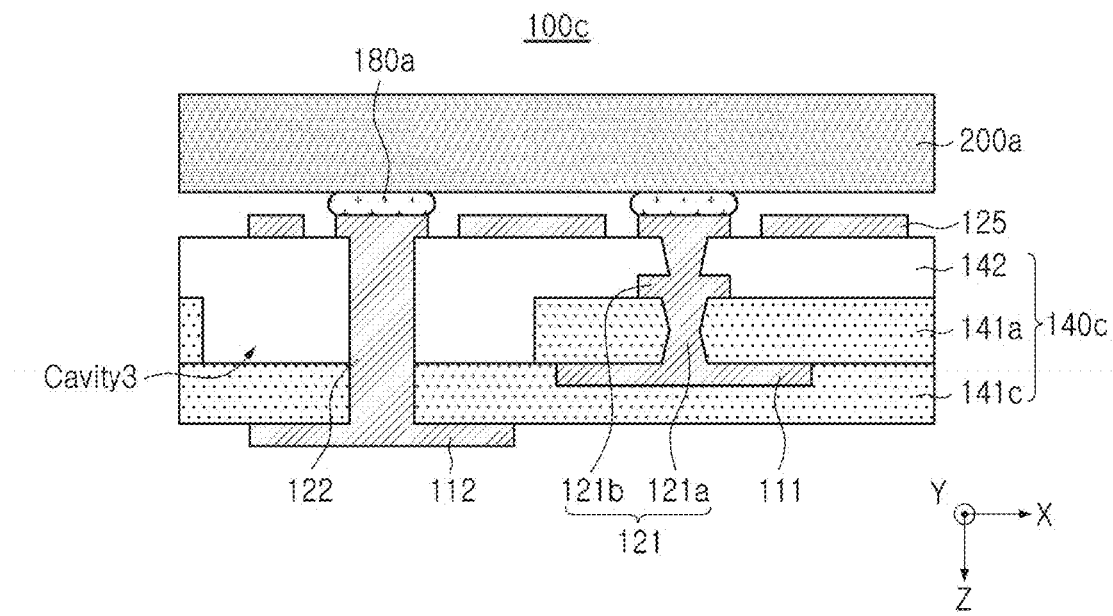

Referring to FIGS. 1A through 1C, the antenna substrates 100a, 100b, and 100c according to an exemplary embodiment in the present disclosure may each further include a connection substrate 200a and/or a solder member 180a. For example, the connection substrate 200a may be implemented as a printed circuit board, may be manufactured separately from other components, and may be electrically connected to each of the first and second patch antennas 111 and 112 through the solder member 180a.

The solder member 180a may have a lower melting point than that of the first and second patch antennas 111 and 112. For example, the solder member 180a may contain a conductive material (for example, tin (Sn)-based material or a lead (Pb)-based material) having a lower melting point than that of copper (Cu) which may be contained in the first and second patch antennas 111 and 112. Accordingly, the solder member 180a in a high fluidity state at a temperature higher than the melting point of the solder member 180a may be disposed between each of the first and second feed vias 121 and 122 and the connection substrate 200a, and the solder member 180a hardened at a low temperature may fix each of the first and second feed vias 121 and 122 and the connection substrate 200a to each other.

Figure 1D:
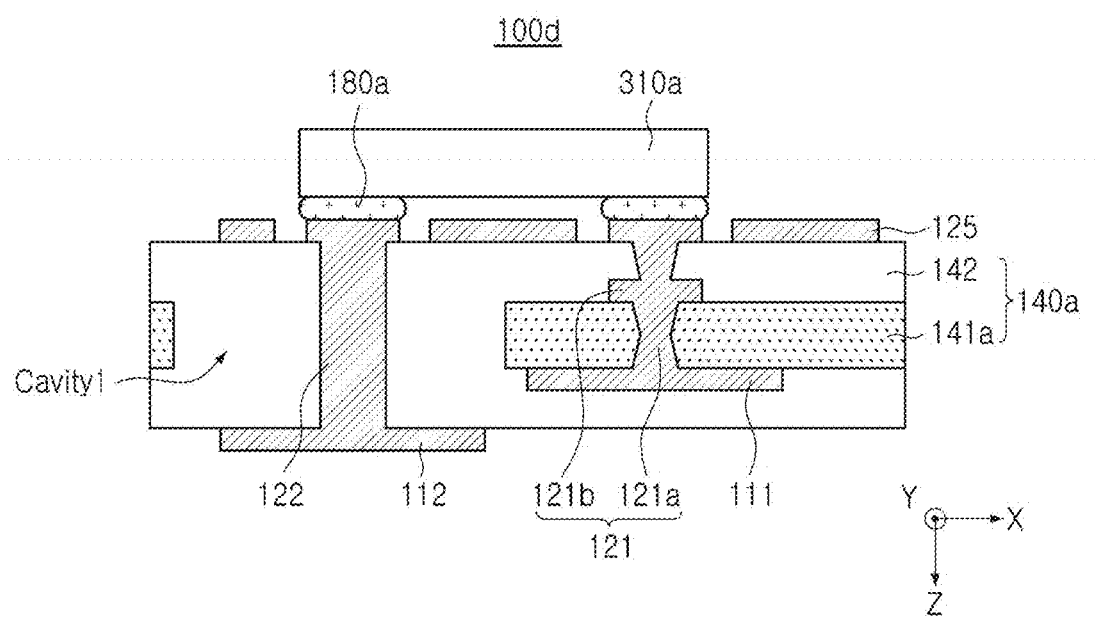
Figure 1E:
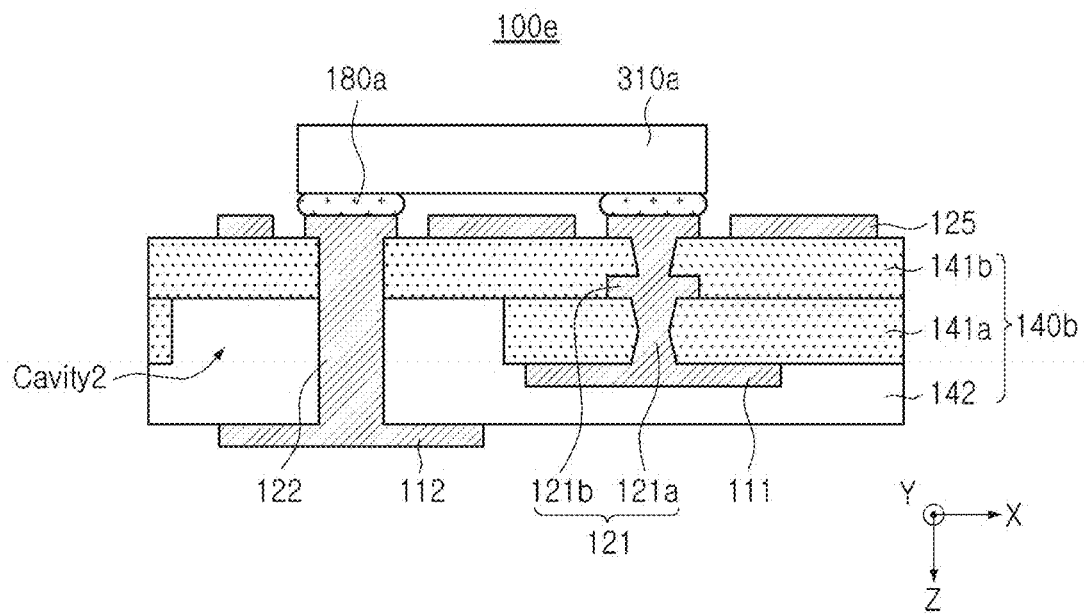
Figure 1F:
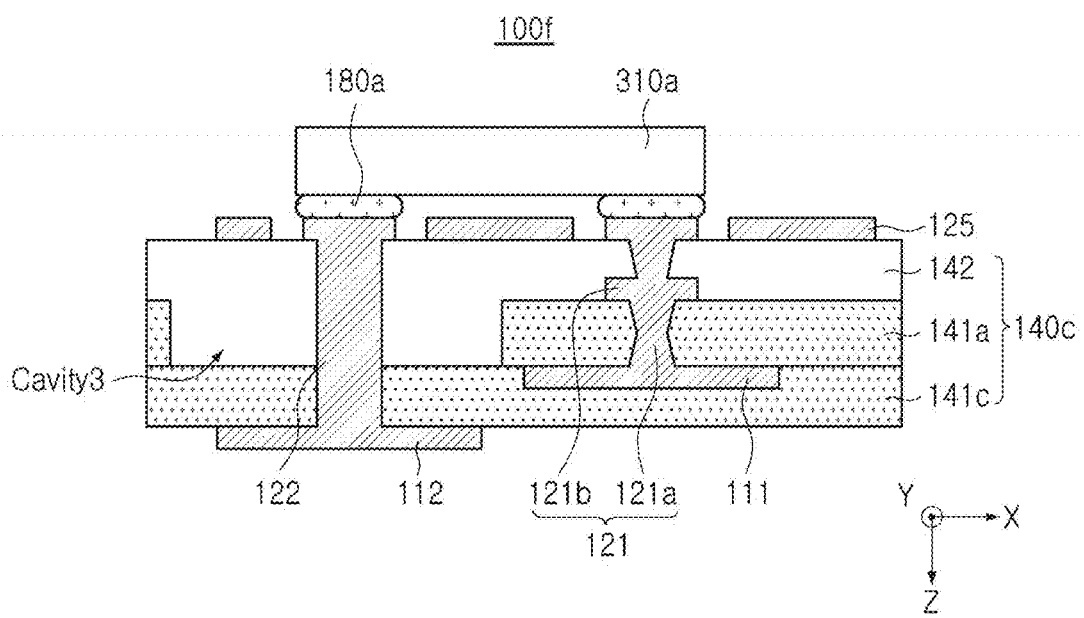

Referring to FIGS. 1D through 1F, the antenna substrates 100d, 100e, and 100f according to an exemplary embodiment in the present disclosure may each further include a radio frequency integrated circuit (RFIC) 310a that inputs or outputs an RF signal to the first and second patch antennas 111 and 112 and converts a frequency of the RF signal. For example, the RFIC 310a may receive a base signal from an electronic device at the time of remote RF signal transmission, may generate the RF signal by increasing a frequency of the base signal, and may generate the base signal by lowering the frequency of the RF signal at the time of remote RF signal reception. The RFIC 310a may perform an amplification operation, a phase control operation, a filtering operation, and a switching operation as well as the frequency conversion depending on design.

Figure 2:
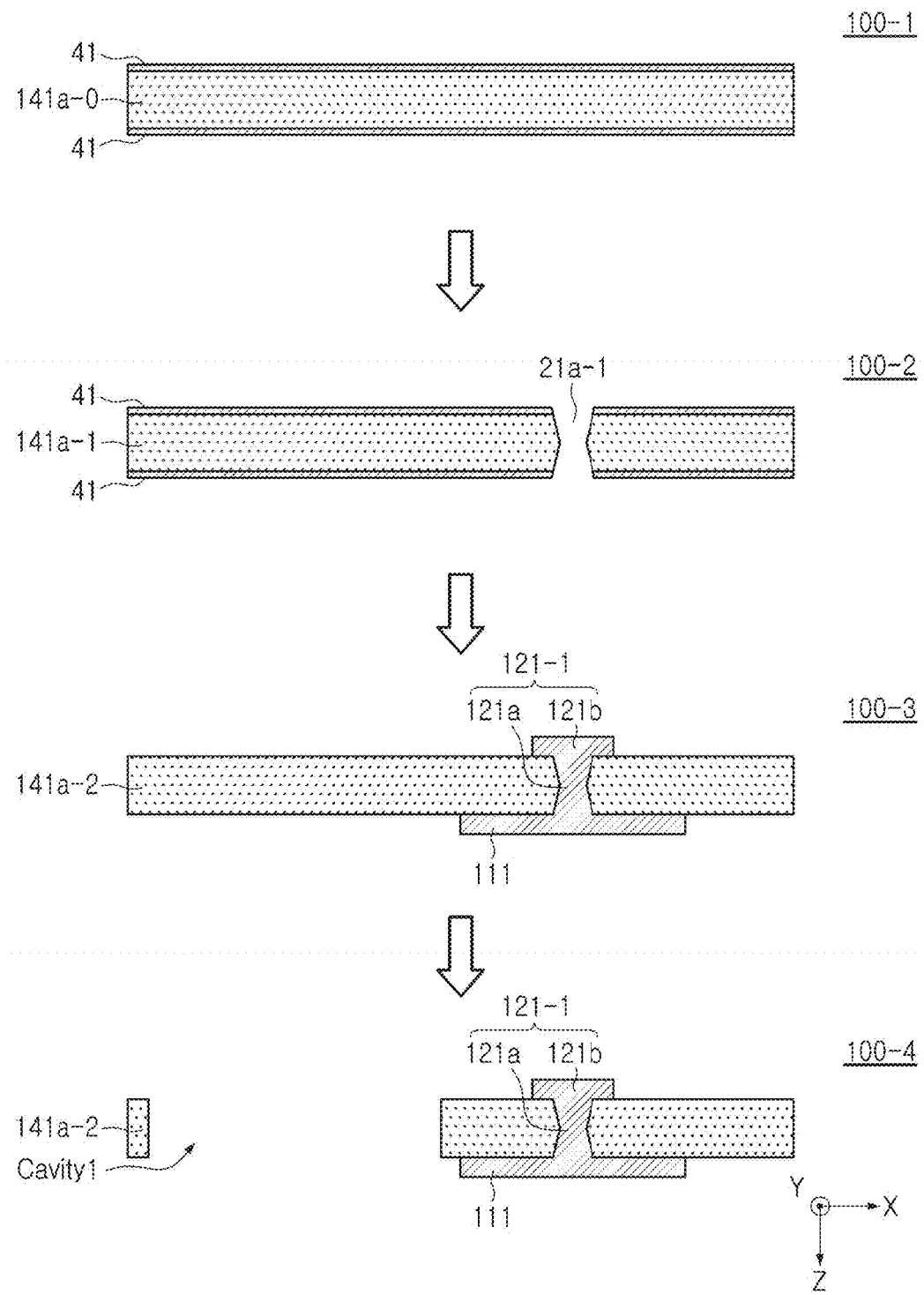
FIG. 2 is a view illustrating the first half of a method for manufacturing the antenna substrate according to an exemplary embodiment in the present disclosure.
Figure 3A:
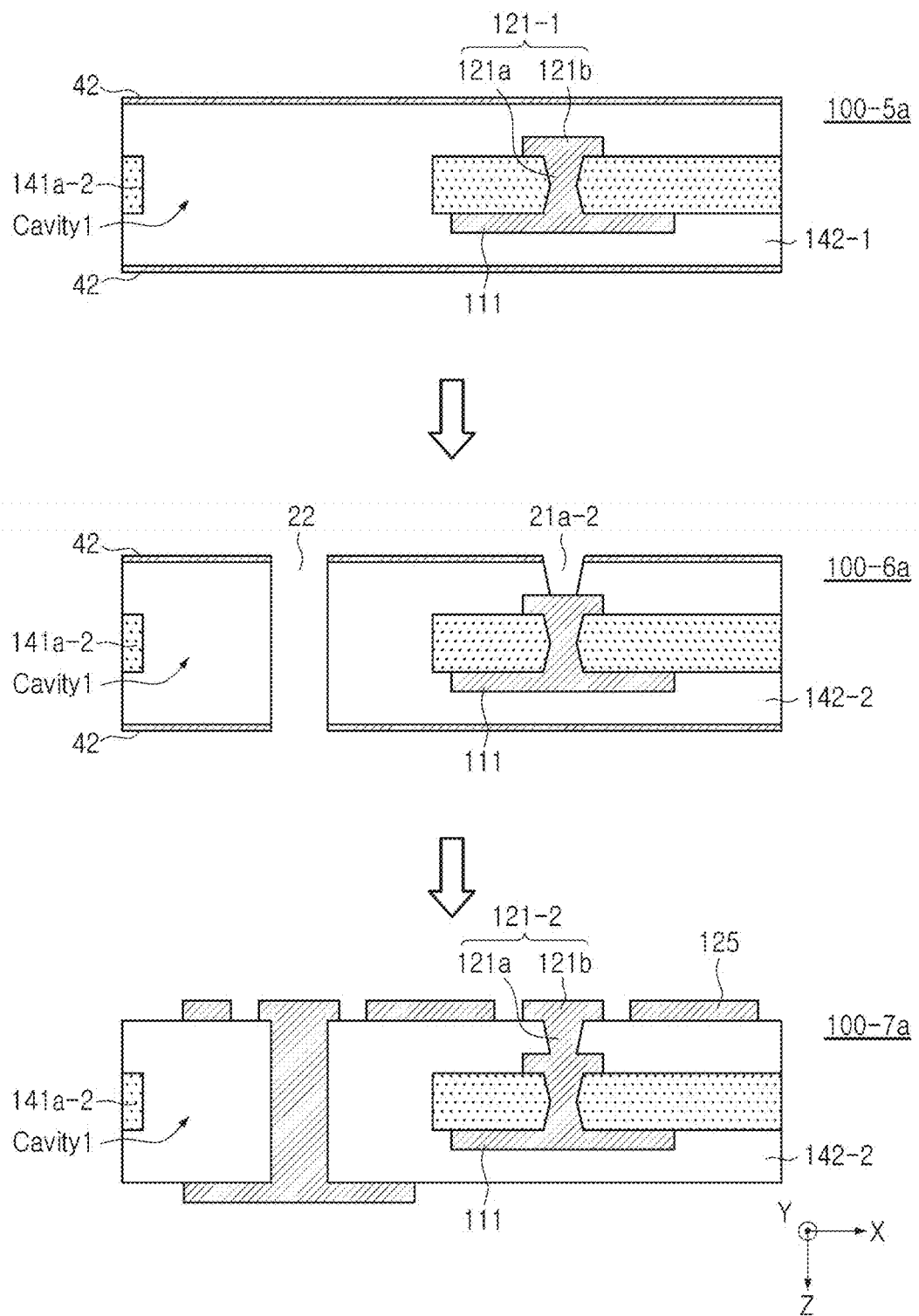
FIGS. 3A through 3C are views illustrating the second half of the method for manufacturing the antenna substrate according to an exemplary embodiment in the present disclosure.
Figure 3B:
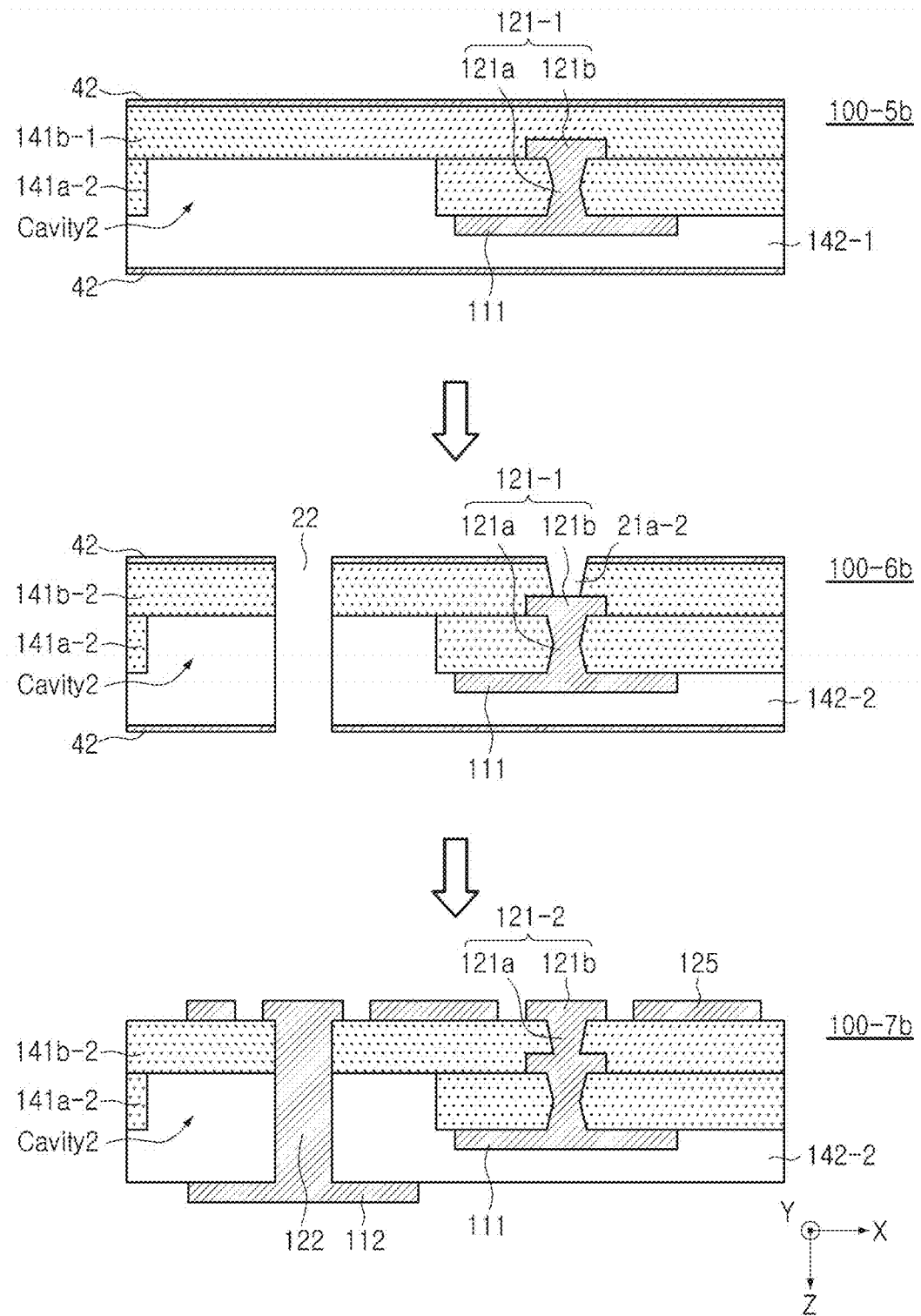
Figure 3C:
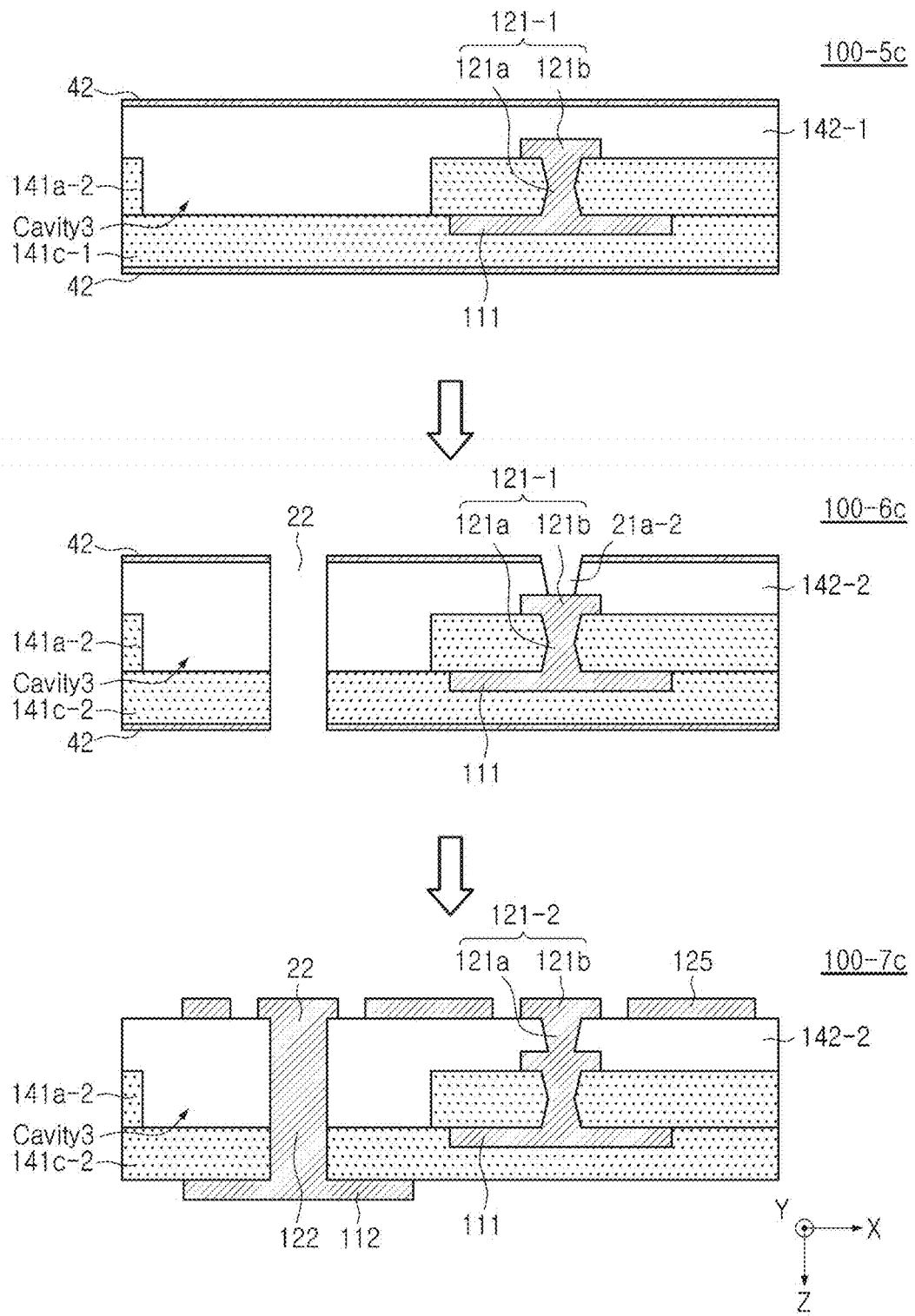

FIG. 2 is a view illustrating the first half of a method for manufacturing the antenna substrate according to an exemplary embodiment in the present disclosure, and FIGS. 3A through 3C are views illustrating the second half of the method for manufacturing the antenna substrate according to an exemplary embodiment in the present disclosure.

Referring to FIGS. 2, 3A, 3B and 3C, the antenna substrate according to an exemplary embodiment in the present disclosure may be manufactured by sequentially performing a first step 100-1, a second step 100-2, a third step 100-3, a fourth step 100-4, a fifth step 100-5a, 100-5b, or 100-5c, a sixth step 100-6a, 100-6b, or 100-6c, and a seventh step 100-7a, 100-7b, or 100-7c. However, since some steps may be omitted or modified, the antenna substrates illustrated in FIGS. 1A through 1F are not limited to being manufactured by the respective steps illustrated in FIGS. 2, 3A, 3B and 3C.

Referring to FIG. 2, the antenna substrate of the first step 100-1 may include a first insulating layer 141a-0 having upper and lower surfaces on which copper foils 41 are disposed, respectively. A structure in which the first insulating layer 141a-0 and the copper foils 41 are combined may be a general copper clad laminate (CCL), but is not limited thereto. The copper foil 41 may be a seed layer of the first patch antenna 111.

A via hole 21*a*-1 may be formed in the first insulating layer 141*a*-0 so that the first insulating layer 141*a*-0 becomes a first insulating layer 141*a*-1 of the antenna substrate in the second step 100-2. A process for forming the via hole 21*a*-1 may be the same as a process (for example, laser drilling) for forming the interlayer via of the printed circuit board, but is not limited thereto.

The antenna substrate of the third step 100-3 may include a first feed via 121-1 in which a via hole of a first insulating layer 141*a*-2 corresponding to the first insulating layer 141*a*-1 is filled with a conductive material, and may include the first patch antenna 111 formed on one surface of the first insulating layer 141*a*-2 so as to be connected to the first feed via 121-1. For example, a land 121*b* of the first feed via 121-1 and the first patch antenna 111 may be formed by photolithography using a photosensitive film that may be temporarily formed on a portion of each of upper and lower surfaces of the first insulating layer 141*a*-2.

The antenna substrate of the fourth step 100-4 may include the first insulating layer 141*a*-2 having the cavity Cavity1. For example, the cavity Cavity1 may be formed in the first insulating layer 141*a*-2 by performing laser cutting, drilling, or polishing by sand blasting.

Referring to FIGS. 3A through 3C, the antenna substrate of the fifth step 100-5*a*, 100-5*b*, or 100-5*c* may include a second insulating layer 142-1 of which at least a portion is disposed in the cavity Cavity1, Cavity2, or Cavity3 of the first insulating layer 141*a*-2 and may further include a third insulating layer 141*b*-1 or 141*c*-1. The copper foil 42 may be formed in a state in which the second insulating layer 142-1 and/or the third insulating layer 141*b*-1 or 141*c*-1 are formed, and may be a seed layer of the second patch antenna 112 and the ground layer 125.

The antenna substrate of the sixth step 100-6*a*, 100-6*b*, or 100-6*c* may include a second insulating layer 142-2 having a through-hole 22 passing through the cavity Cavity1, Cavity2, or Cavity3 and may have a via hole 21*a*-2. The through-hole 22 may also be formed in a third insulating layer 141*b*-2 or 141*c*-2.

The antenna substrate of the seventh step 100-7*a*, 100-7*b*, or 100-7*c* may have a structure in which a first feed via 121-2, the second feed via 122, the second patch antenna 112, and the ground layer 125 are formed. For example, the first feed via 121-2 and the second feed via 122 may be formed by filling the via holes with a conductive material, and the second patch antenna 112 and the ground layer 125 may be formed by photolithography using a photosensitive film.

Figure 4A:
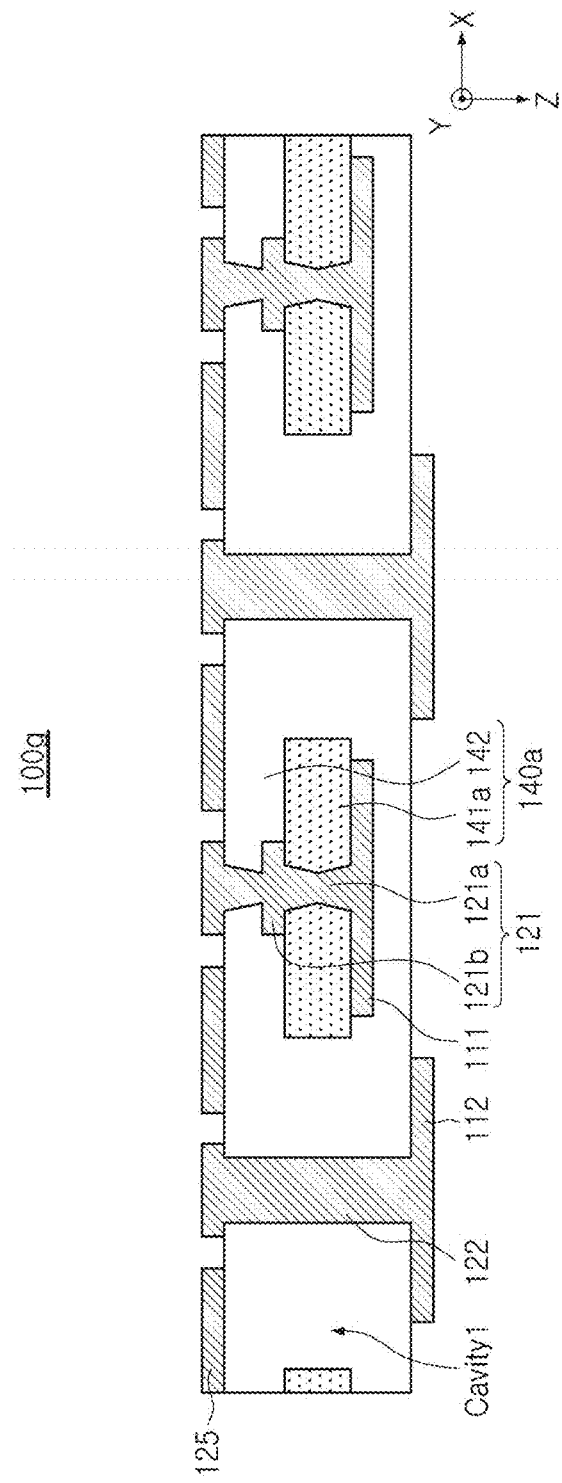
FIGS. 4A through 4C are side views illustrating a modified structure of the antenna substrate according to an exemplary embodiment in the present disclosure.
Figure 4B:
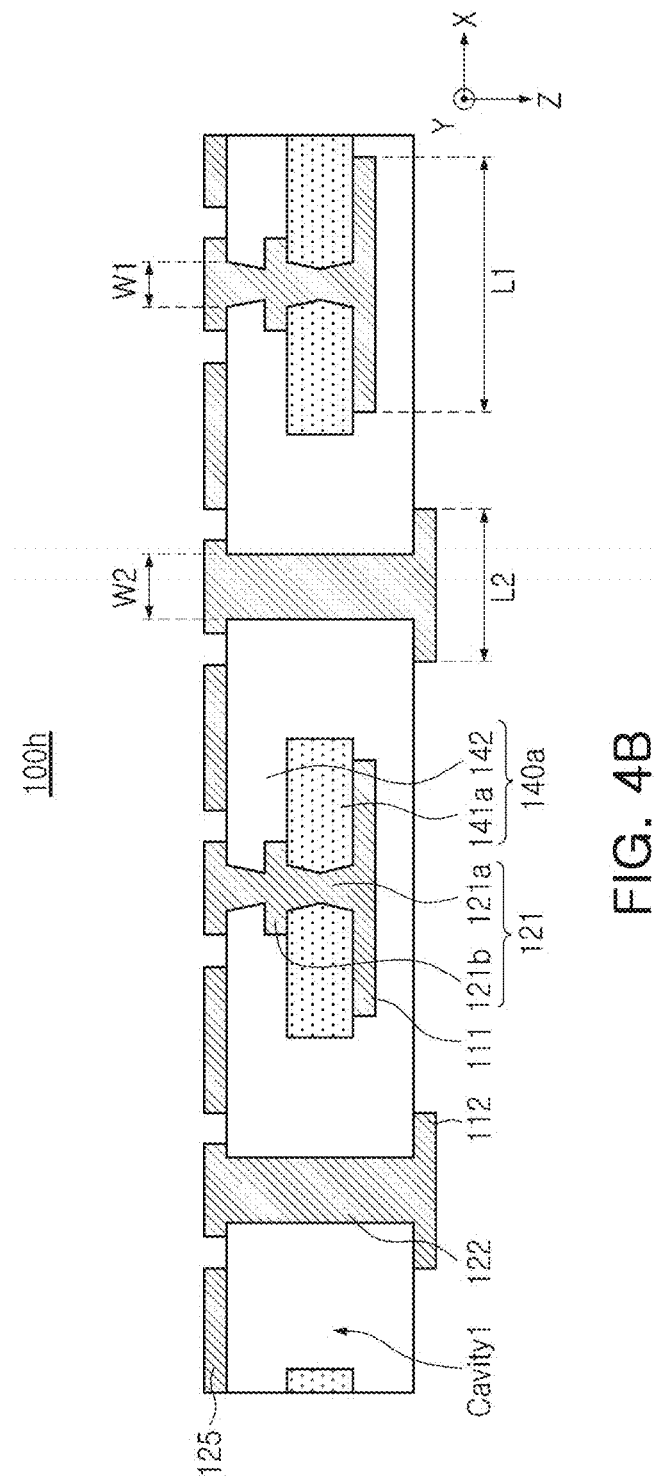
Figure 4C:
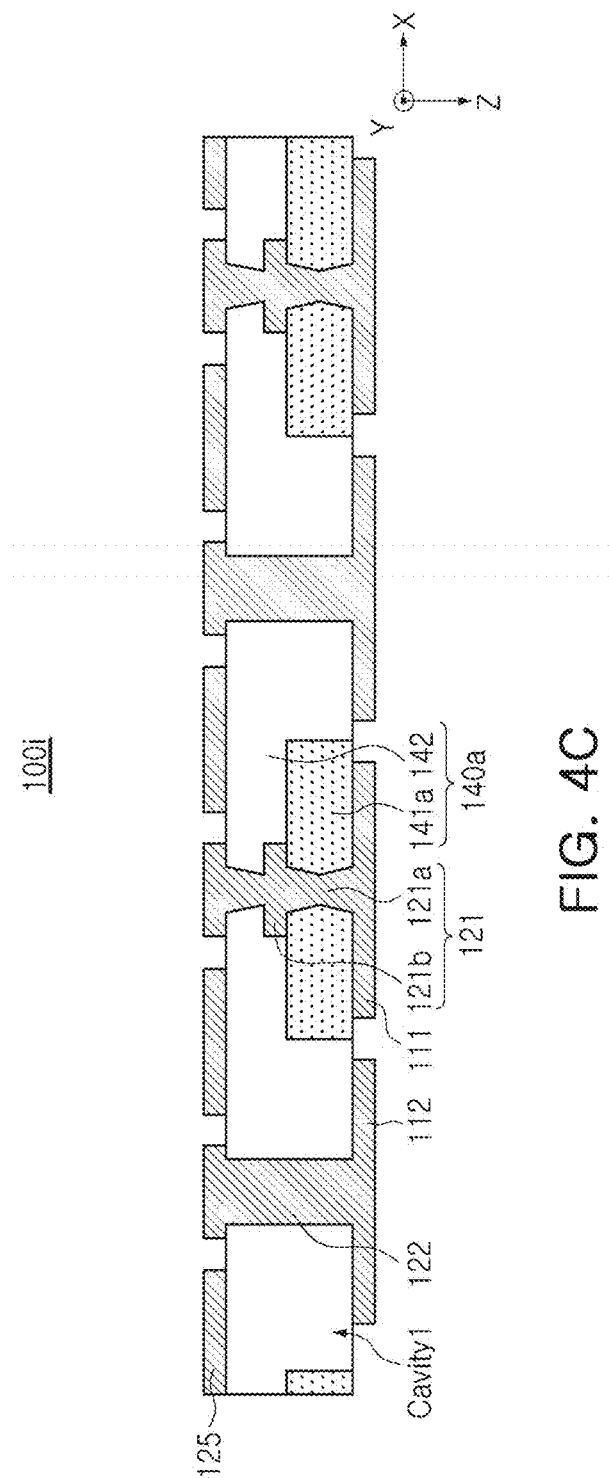

FIGS. 4A through 4C are side views illustrating a modified structure of the antenna substrate according to an exemplary embodiment in the present disclosure.

Referring to FIG. 4A, in the antenna substrate 100*g* according to an exemplary embodiment in the present disclosure, the number of cavities Cavity1 is plural, the number of second patch antennas 112 is plural, and at least some of the first patch antennas 111 each overlap with a region between the second patch antennas 112 in a direction (for example, the Z-direction) in which one surface of the first patch antenna 111 faces the region. Accordingly, in the antenna substrate 100*g*, an arrangement region of the first patch antenna 111 and an arrangement region of the second patch antenna 112 may be efficiently used, and thus, the antenna substrate 100*g* may have a reduced size while having a structure for remote transmission and reception of the first and second RF signals.

Referring to FIG. 4B, the antenna substrate 100*h* according to an exemplary embodiment in the present disclosure may have a structure in which areas L1 and L2 of one surfaces of the first and second patch antennas 111 and 112 are different from each other. Accordingly, the frequency bands of the first and second patch antennas 111 and 112 may be different from each other.

Further, a width W2 of one end of the second feed via 122 may be larger than a width W1 of one end of the first feed via 121. The area L2 of one surface of the second patch antenna 112 may be smaller than an area of the cavity Cavity1. Accordingly, efficiency in electromagnetic coupling between the second patch antenna 112 and the ground layer 125 may be increased.

Referring to FIGS. 4A and 4B, a distance between the ground layer 125 and the first patch antenna 111 may be different from a distance between the ground layer 125 and the second patch antenna 112. For example, in a case in which the frequency band of the first patch antenna 111 is lower than that of the second patch antenna 112, the wavelength of the first RF signal remotely transmitted and received by the first patch antenna 111 may be longer than that of the second RF signal. Therefore, the distance between the ground layer 125 and the first patch antenna 111 may be less than the distance between the ground layer 125 and the second patch antenna 112.

Referring to FIG. 4C, in the antenna substrate 100*i* according to an exemplary embodiment in the present disclosure, the distance between the ground layer 125 and the first patch antenna 111 may be the same as the distance between the ground layer 125 and the second patch antenna 112 depending on design. That is, the frequencies of the first and second RF signals may be substantially the same as each other depending on design.

Figure 5A:
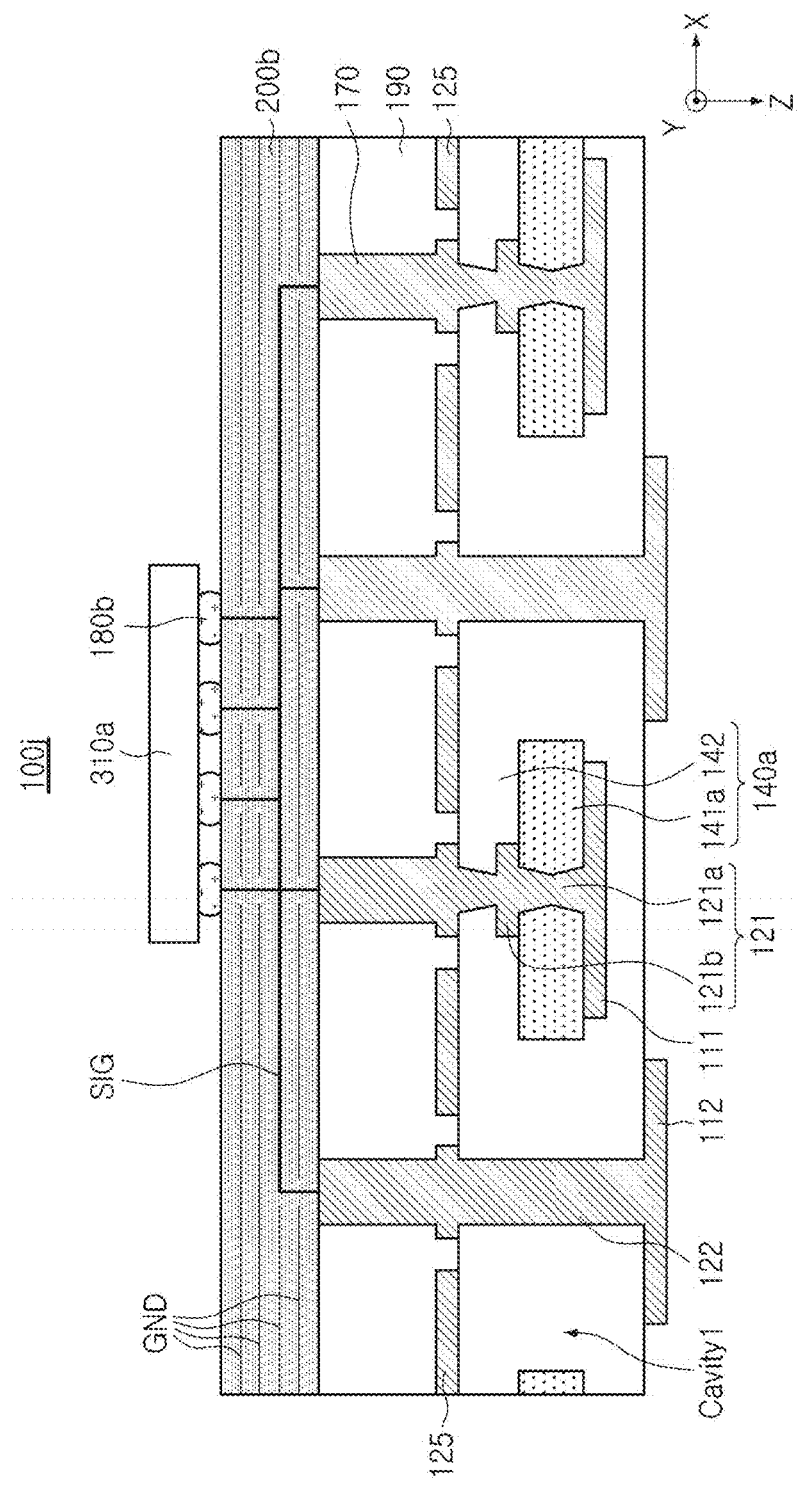
FIGS. 5A and 5B are side views each illustrating a portion of an electronic device including the antenna substrate according to an exemplary embodiment in the present disclosure.
Figure 5B:
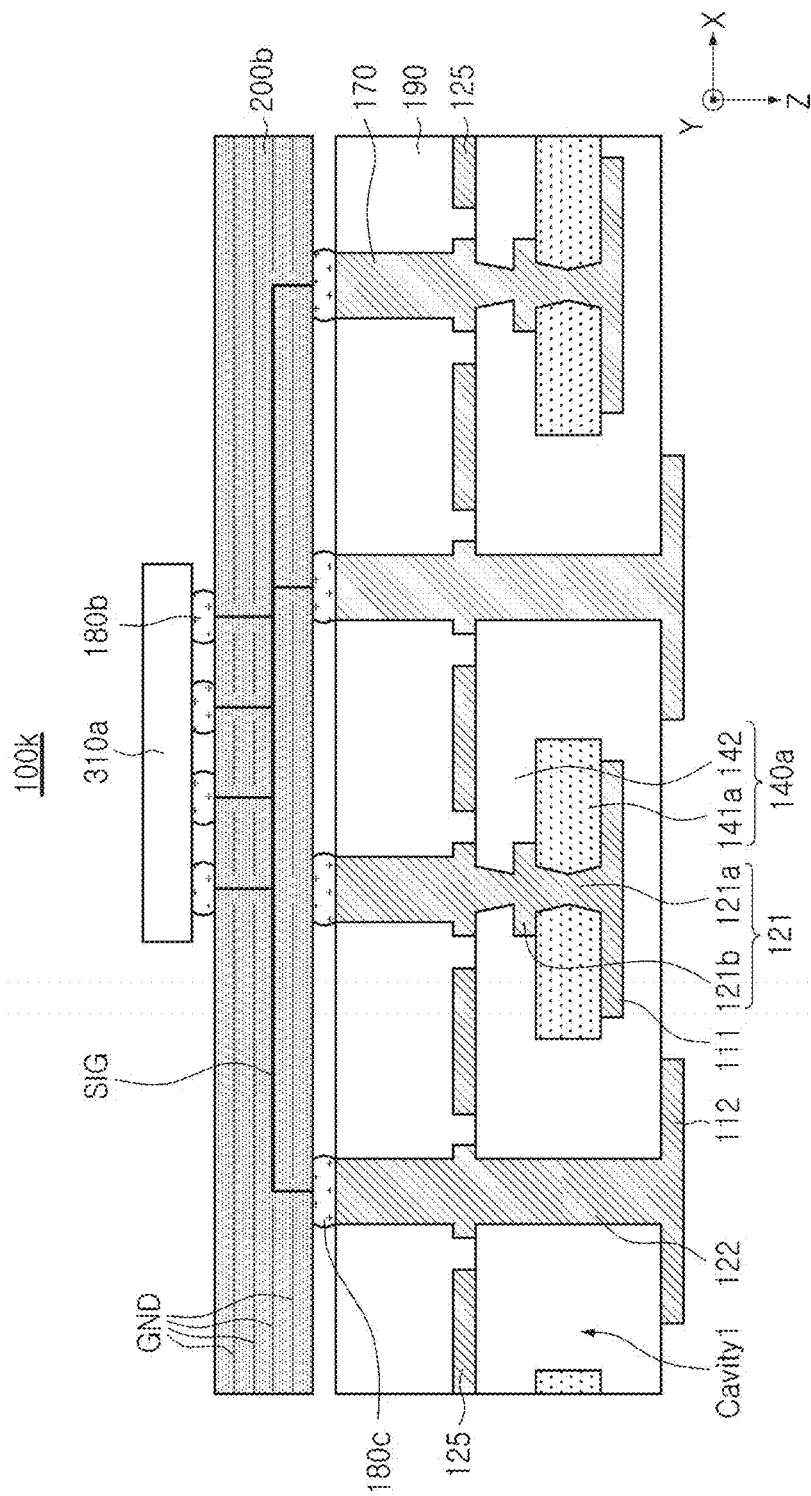

FIGS. 5A and 5B are side views each illustrating a portion of an electronic device including the antenna substrate according to an exemplary embodiment in the present disclosure.

Referring to FIGS. 5A and 5B, portions 100*j* and 100*k* of the electronic device including the antenna substrate according to an exemplary embodiment in the present disclosure may each have a structure in which a connection substrate 200*b* is connected between the RFIC 310*a* and the antenna substrate of FIG. 4A. A solder member 180*b* with a low melting point may connect and fix the RFIC 310*a* and the connection substrate 200*b* to each other.

The connection substrate 200*b* may include a wiring SIG through which the first and second RF signals are transmitted, and a ground plate GND. The wiring SIG may be connected between the first and second feed vias 121 and 122 and the RFIC 310*a*.

A core member 190 may be connected between the connection substrate 200*b* and the antenna substrate of FIG. 4A, and may include a core via 170. The core via 170 may connect the wiring SIG and the first and second feed vias 121 and 122 to each other. Since the core member 190 may be omitted depending on design, the antenna substrate according to an exemplary embodiment in the present disclosure may also be implemented as a coreless printed circuit board depending on design.

Referring to FIG. 5B, a solder member 180*c* with a low melting point may connect and fix the core member 190 and the connection substrate 200*b* to each other. The solder members 180*b* and 180*c* may be the same as the solder member 180*a* illustrated in FIGS. 1A through 1F.

Figure 5C:
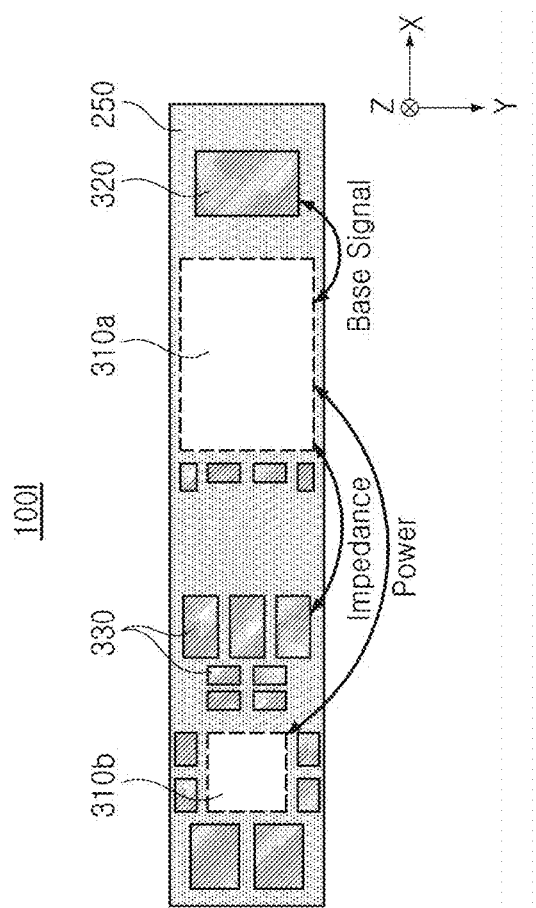
FIG. 5C is a rear view illustrating a portion of the electronic device including the antenna substrate according to an exemplary embodiment in the present disclosure.

FIG. 5C is a rear view illustrating a portion of the electronic device including the antenna substrate according to an exemplary embodiment in the present disclosure.

Referring to FIG. 5C, a portion 100I of the electronic device including the antenna substrate according to an exemplary embodiment in the present disclosure may further include at least one of a surface layer 250, a power management integrated circuit (PMIC) 310b, a connector 320, or a passive component 330.

The RFIC 310a may input or output an RF signal through a plurality of holes in the surface layer 250. The surface layer 250 may be a solder resist layer of a printed circuit board.

For example, the RFIC 310a may receive the base signal from the connector 320 at the time of remote RF signal transmission, may generate the RF signal by increasing the frequency of the base signal, and may generate the base signal by lowering the frequency of the RF signal at the time of remote RF signal reception. The RFIC 310a may perform an amplification operation, a phase control operation, a filtering operation, and a switching operation as well as the frequency conversion depending on design.

For example, the PMIC 310b may provide power to the RFIC 310a, and the passive component 330 may provide impedance to the RFIC 310a. The impedance may be a part of an oscillator or mixer that may be used for frequency conversion, an input/output impedance of an amplifier, or a part of a DC-DC converter that may be used at the time of power generation in the PMIC 310b. The connector 320 may be a part of a coaxial cable.

Figure 6:
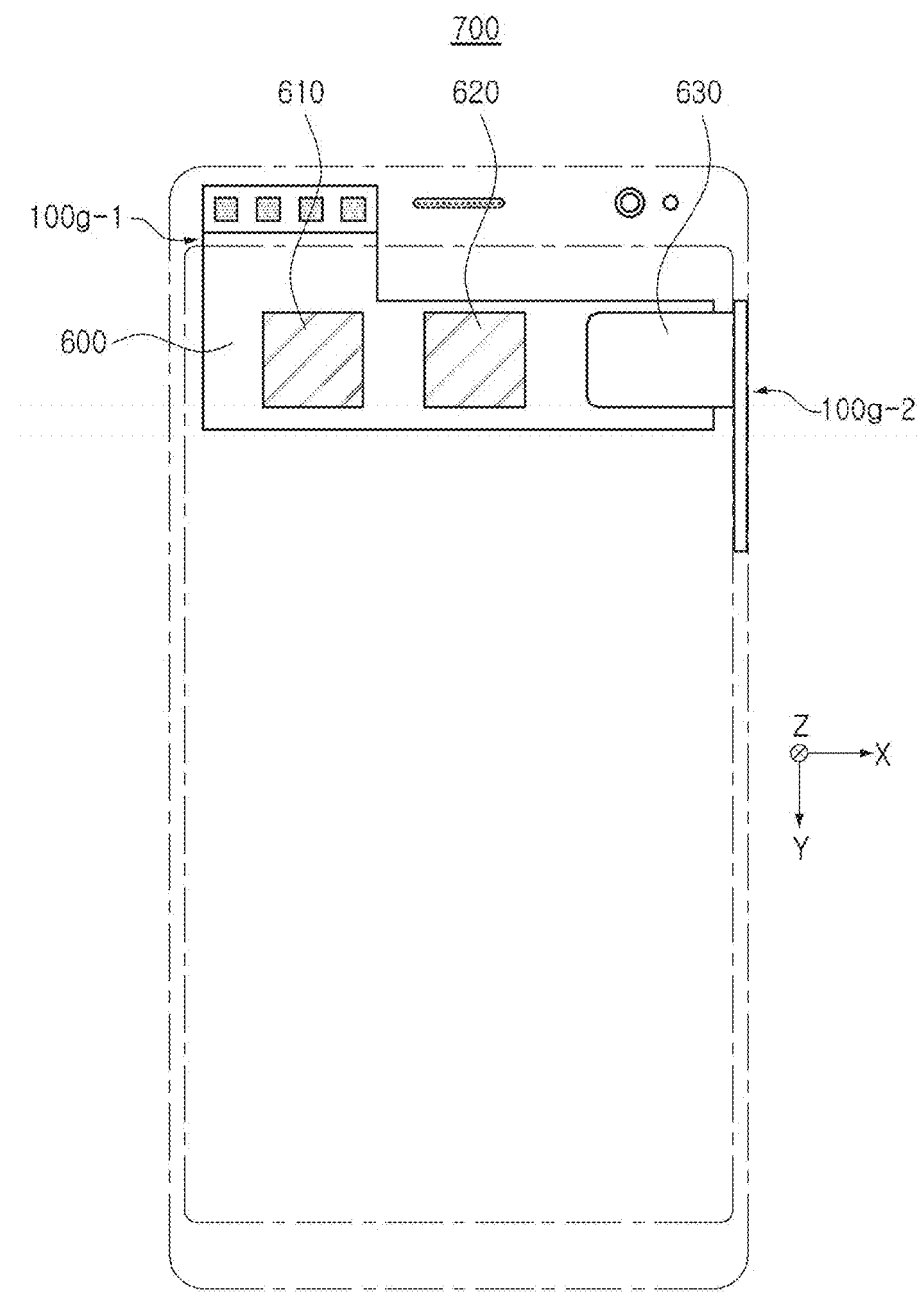
FIG. 6 is a view illustrating the electronic device including the antenna substrate according to an exemplary embodiment in the present disclosure.

FIG. 6 is a view illustrating the electronic device including the antenna substrate according to an exemplary embodiment in the present disclosure.

Referring to FIG. 6, antenna substrates 100g-1 and 100g-2 according to an exemplary embodiment in the present disclosure may be disposed adjacent to a plurality of different edges of an electronic device 700, respectively.

The electronic device 700 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like, but is not limited thereto.

The electronic device 700 may include a base substrate 600, and the base substrate 600 may include a communications modem 610 and a baseband IC 620.

The communications modem 610 may include at least some of a memory chip such as a volatile memory (for example, a dynamic random access memory (DRAM)), a non-volatile memory (for example, a read only memory (ROM)), or a flash memory; an application processor chip such as a central processor (for example, a central processing unit (CPU)), a graphics processor (for example, a graphics processing unit (GPU)), a digital signal processor, a cryptographic processor, a microprocessor, or a microcontroller; and a logic chip such as an analog-to-digital converter, or an application-specific integrated circuit (ASIC).

The baseband IC 620 may generate the base signal by performing analog-to-digital conversion, and amplification, filtering, and frequency conversion for an analog signal. The base signal input and output from the baseband IC 620 may be transmitted to the antenna substrate 100g-1 through the coaxial cable, and the coaxial cable may be electrically connected to the connector of the antenna substrate 100g-1. The antenna substrate 100g-2 may also be connected to the base substrate 600 through a flexible substrate 630 depending on design.

For example, the frequency of the base signal may be in a baseband, and may be a frequency (for example, several GHz) corresponding to an intermediate frequency (IF). The frequency (for example, 28 GHz or 39 GHz) of the RF signal may be higher than the IF and may correspond to millimeter wave (mmWave). The RF signal may have a format according to protocols such as wireless fidelity (Wi-Fi) (Institute of Electrical And Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated as being subsequent to the abovementioned protocols.

As set forth above, according to the exemplary embodiment in the present disclosure, the antenna substrate may provide a structure in which at least some of factors determining bands or performance of a plurality of patch antennas are different from each other, and may suppress an increase in overall size resulting from the structure or an increase in possibility of warpage of the substrate.

For example, the antenna substrate according to an exemplary embodiment in the present disclosure may efficiently provide a plurality of different frequency bands.

While exemplary embodiments have been shown and described above, it will be apparent to those skilled in the art that modifications and variations could be made without departing from the scope of the present disclosure as defined by the appended claims.

What is claimed is:

1. An antenna substrate comprising:
a first insulating layer surrounding a cavity;
a second insulating layer of which at least a portion is disposed in the cavity and containing an insulating material different from an insulating material of the first insulating layer; a first patch antenna having one surface facing the first insulating layer by an amount greater than half of an area of the first patch antenna; and a second patch antenna having one surface facing the cavity by an amount greater than half of an area of the second patch antenna.

2. The antenna substrate of claim 1, wherein another portion of the second insulating layer is disposed on at least one of an upper surface and a lower surface of the first insulating layer.

3. The antenna substrate of claim 1, wherein a solidity of the first insulating layer is higher than a solidity of the second insulating layer.

4. The antenna substrate of claim 1, wherein areas of the one surfaces of the first and second patch antennas are different from each other.

5. The antenna substrate of claim 1, wherein an area of the one surface of the second patch antenna is smaller than an area of the cavity.

6. The antenna substrate of claim 1, wherein the number of cavities is plural,
the number of second patch antennas is plural, and
the first patch antenna overlaps with a region between the second patch antennas in a direction in which the one surface of the first patch antenna faces the region.

7. The antenna substrate of claim 1, further comprising a ground layer overlapping with the first and second patch antennas in a direction in which the one surfaces of the first and second patch antennas face the ground layer, wherein a distance between the ground layer and the first patch antenna is different from a distance between the ground layer and the second patch antenna.

8. The antenna substrate of claim 7, further comprising first and second feed vias penetrating through the ground layer and spaced apart from the ground layer.

9. The antenna substrate of claim 1, further comprising:
  a first feed via penetrating through the first insulating layer and contacting the first insulating layer; and a second feed via passing through the cavity and spaced apart from the first insulating layer.

10. An electronic device comprising:
  the antenna substrate of claim 1; and a radio frequency integrated circuit (RFIC) that inputs or outputs a radio frequency (RF) signal to the first and second patch antennas of the antenna substrate and converts a frequency of the RF signal.

11. The electronic device of claim 10, further comprising:
  a connection substrate disposed between the antenna substrate and the RFIC; and a solder member connecting the antenna substrate and the connection substrate to each other and having a melting point lower than a melting point of the first and second patch antennas.

* * * * *